(12) United States Patent
Pan et al.

(10) Patent No.: US 9,711,469 B2
(45) Date of Patent: Jul. 18, 2017

(54) SEMICONDUCTOR STRUCTURE HAVING RECESS AND MANUFACTURING METHOD THEREOF

(71) Applicant: XINTEC INC., Taoyuan (TW)

(72) Inventors: Geng-Peng Pan, Taoyuan (TW); Yi-Ming Chang, Taoyuan (TW); Chia-Sheng Lin, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/715,445

(22) Filed: May 18, 2015

(65) Prior Publication Data

US 2015/0340330 A1 Nov. 26, 2015

Related U.S. Application Data

(60) Provisional application No. 62/001,919, filed on May 22, 2014.

(51) Int. Cl.
| | |
|---|---|
| *H01L 23/00* | (2006.01) |
| *H01L 21/033* | (2006.01) |
| *H01L 21/302* | (2006.01) |
| *H01L 23/48* | (2006.01) |
| *H01L 21/268* | (2006.01) |
| *H01L 21/48* | (2006.01) |
| *H01L 21/768* | (2006.01) |

(52) U.S. Cl.
CPC .......... *H01L 24/05* (2013.01); *H01L 21/0334* (2013.01); *H01L 21/268* (2013.01); *H01L 21/302* (2013.01); *H01L 21/48* (2013.01); *H01L 21/76898* (2013.01); *H01L 23/481* (2013.01); *H01L 24/03* (2013.01); *H01L 2224/0231* (2013.01); *H01L 2224/02371* (2013.01); *H01L 2224/02372* (2013.01); *H01L 2224/03831* (2013.01); *H01L 2224/05017* (2013.01); *H01L 2224/05024* (2013.01); *H01L 2224/05025* (2013.01); *H01L 2224/0557* (2013.01); *H01L 2224/05557* (2013.01)

(58) Field of Classification Search
CPC ....... H01L 23/00; H01L 23/48; H01L 21/302; H01L 21/268; H01L 21/033
USPC ............... 257/622, 448, 768, 771, 741, 757; 438/98
See application file for complete search history.

(56) References Cited

U.S. PATENT DOCUMENTS

2011/0024864 A1* 2/2011 Kokusenya et al. .......... 257/448

FOREIGN PATENT DOCUMENTS

TW 200531142 9/2005

\* cited by examiner

*Primary Examiner* — Sheng Zhu
(74) *Attorney, Agent, or Firm* — Liu & Liu

(57) ABSTRACT

A manufacturing method of a semiconductor structure includes the following steps. A first isolation layer is formed on a first surface of a wafer substrate. A conductive pad is formed on the first isolation layer. A hollow region through the first surface and a second surface of the wafer substrate is formed, such that the first isolation layer is exposed through the hollow region. A laser etching treatment is performed on the first isolation layer that is exposed through the hollow region, such that a first opening is formed in the first isolation layer, and a concave portion exposed through the first opening is formed in the conductive pad.

11 Claims, 8 Drawing Sheets

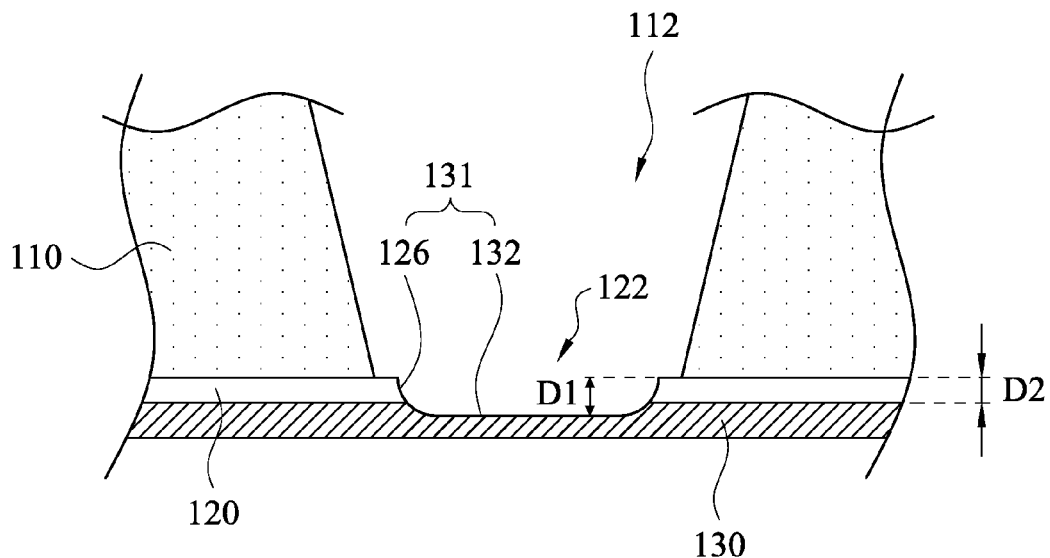

Fig. 3

| A first isolation layer is formed on a first surface of a wafer substrate. | S1 |

⇩

| A conductive pad is formed on the first isolation layer. | S2 |

⇩

| A hollow region through the first surface and a second surface of the wafer substrate is formed, such that the first isolation layer is exposed through the hollow region. | S3 |

⇩

| A laser etching treatment is performed on the first isolation layer that is exposed through the hollow region, such that a first opening is formed in the first isolation layer, and a concave portion exposed through the first opening is formed in the conductive pad. | S4 |

Fig. 4

SEMICONDUCTOR STRUCTURE HAVING RECESS AND MANUFACTURING METHOD THEREOF

RELATED APPLICATIONS

This application claims priority to U.S. provisional Application Ser. No. 62/001,919, filed May 22, 2014, which is herein incorporated by reference.

BACKGROUND

Field of Invention

The present invention relates to a semiconductor structure and a manufacturing method of the semiconductor structure.

Description of Related Art

A typical semiconductor structure includes a wafer substrate having a through hole, a first isolation layer, a conductive pad, a second isolation layer, and a redistribution layer. The first isolation layer is located on the surface of the wafer substrate and covers an end of the through hole of the wafer substrate. After the first isolation layer and the conductive pad are formed on the surface of the wafer substrate, an opening is formed by photolithography (e.g., dry-etching process) in the first isolation layer on the conductive pad, such that the conductive pad is exposes through the opening of the first isolation layer. Thereafter, the second isolation layer is formed on the first isolation layer and the conductive pad that is in the opening of the first isolation layer. Subsequently, another opening is photo lithographically formed in the second isolation layer on the conductive pad, and the redistribution layer is formed on the second isolation layer and the conductive pad that is in the opening of the second isolation layer, such that the redistribution layer electrically contacts the conductive pad.

However, when the dry-etching process is performed in the first isolation layer that is on the conductive pad to form the opening, a V-shaped recess may be simultaneously formed in the conductive pad due to the process limitation. As a result, when the redistribution layer electrically contacts the conductive pad, the contact area therebetween is too small to provide a sufficient electrical contact, which reduces the yield rate. Moreover, if the thickness of the conductive pad becomes thinner, the conductive pad is more easily penetrated by the formation of the V-shaped recess in the dry-etching process, thereby damaging other elements under the conductive pad.

SUMMARY

An aspect of the present invention is to provide a semiconductor structure.

According to an embodiment of the present invention, a semiconductor structure includes a wafer substrate, a first isolation layer, and a conductive pad. The wafer substrate has a hollow region, a first surface, and a second surface opposite to the first surface. The hollow region is through the first and second surfaces. The first isolation layer is located on the first surface of the wafer substrate and has a first opening. The first opening is communicated with the hollow region. The conductive pad is located on a surface of the first isolation layer facing away from the wafer substrate. The conductive pad covers the first opening, such that the conductive pad is exposed through the hollow region. The conductive pad has a concave portion that faces the first opening, and the first isolation layer has an oblique surface that surrounds the first opening, such that a recess with U-shaped cross-section is formed by the concave portion and the oblique surface.

In one embodiment of the present invention, the wafer substrate has a third surface that surrounds the hollow region, and the semiconductor structure further includes a second isolation layer. The second isolation layer is located on the recess and the second and third surfaces of the wafer substrate and has a second opening, such that the conductive pad is exposed through the second opening.

In one embodiment of the present invention, the semiconductor structure further includes a redistribution layer. The redistribution layer is located on the second isolation layer and electrically contacts the conductive pad that is exposed through the second opening.

In one embodiment of the present invention, a depth of the recess is greater than a thickness of the first isolation layer.

Another aspect of the present invention is to provide a manufacturing method of a semiconductor structure.

According to an embodiment of the present invention, a manufacturing method of a semiconductor structure includes the following steps. A first isolation layer is formed on a first surface of a wafer substrate. A conductive pad is formed on the first isolation layer. A hollow region through the first surface and a second surface of the wafer substrate is formed, such that the first isolation layer is exposed through the hollow region. A laser etching treatment is performed on the first isolation layer that is exposed through the hollow region, such that a first opening is formed in the first isolation layer, and a concave portion exposed through the first opening is formed in the conductive pad.

In one embodiment of the present invention, the wafer substrate has a third surface that surrounds the hollow region, the first isolation layer has an oblique surface that surrounds the first opening, a recess is formed by the concave portion and the oblique surface, and the manufacturing method further includes forming a second isolation layer on the recess and the second and third surfaces of the wafer substrate.

In one embodiment of the present invention, the manufacturing method further includes patterning the second isolation layer, such that a second opening is formed in the second isolation layer to expose the conductive pad.

In one embodiment of the present invention, patterning the second isolation layer includes the following steps. A patterned photoresist layer is formed on the second isolation layer. A portion of the second isolation layer that is not covered by the photoresist layer is etched, such that the second opening is formed in the second isolation layer to expose the conductive pad. The photoresist layer is removed.

In one embodiment of the present invention, the manufacturing method further includes forming a redistribution layer on the second isolation layer and the conductive pad that is exposed through the second opening.

In one embodiment of the present invention, performing the laser etching treatment on the first isolation layer includes the following steps. A mask that has a through hole is provided. A laser light irradiates the first isolation layer through the through hole of the mask.

In the aforementioned embodiments of the present invention, the laser etching treatment is performed on the first isolation layer to form the first opening, and the concave portion exposed through the first opening may be formed in the conductive pad at the same time when the first isolation layer is etched by laser. Hence, the first isolation layer has the oblique surface that surrounds the first opening, such that the recess with U-shaped cross-section may be formed by the concave portion and the oblique surface. As a result, when the redistribution layer is formed on the surface of the conductive pad for electrical contact, the contact area between the U-shaped recess and the redistribution layer is enough, so that poor contact is not prone to occur. Therefore, the yield rate of the semiconductor structure may be improved. Moreover, since the precision of the laser etching treatment is high, the risk of penetrating the conductive pad may be reduced and the thickness of the conductive pad may be decreased for saving cost.

Another aspect of the present invention is to provide a manufacturing method of a semiconductor structure.

According to an embodiment of the present invention, a manufacturing method of a semiconductor structure includes the following steps. A first isolation layer is formed on a first surface of a wafer substrate. A conductive pad is formed on the first isolation layer. A hollow region through the first surface and a second surface of the wafer substrate is formed, such that the first isolation layer is exposed through the hollow region, and a third surface is formed on the wafer substrate surrounding the hollow region. A second isolation layer is formed on the second and third surfaces of the wafer substrate and the first isolation layer that is exposed through the hollow region. A laser etching treatment is performed on the first and second isolation layers in the hollow region, such that a first opening is formed in the first isolation layer, a second opening is formed in the second isolation layer, and a concave portion exposed through the first and second openings is formed in the conductive pad.

In one embodiment of the present invention, the manufacturing method further includes forming a redistribution layer on the second isolation layer and the conductive pad that is exposed through the first and second openings.

In one embodiment of the present invention, performing a laser etching treatment on the first and second isolation layers includes the following steps. A mask that has a through hole is provided. A laser light irradiates the first isolation layer through the through hole of the mask.

In the aforementioned embodiments of the present invention, the laser etching treatment is performed on the first and second isolation layers to respectively form the first and second openings, and the concave portion exposed through the first and second openings may be formed in the conductive pad at the same time when the first and second isolation layers are etched by laser. As a result, when the redistribution layer is formed on the surface of the conductive pad for electrical contact, the contact area between the U-shaped recess and the redistribution layer is enough, so that poor contact is not prone to occur. Therefore, the yield rate of the semiconductor structure may be improved. Moreover, since the precision of the laser etching treatment is high, the risk of penetrating the conductive pad may be reduced and the thickness of the conductive pad may be decreased for saving cost.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 3 is a partially enlarged view of the semiconductor structure shown in FIG. 2;

FIG. 4 is a flow chart of a manufacturing method of a semiconductor structure according to one embodiment of the present invention;

DETAILED DESCRIPTION

Figure 1:
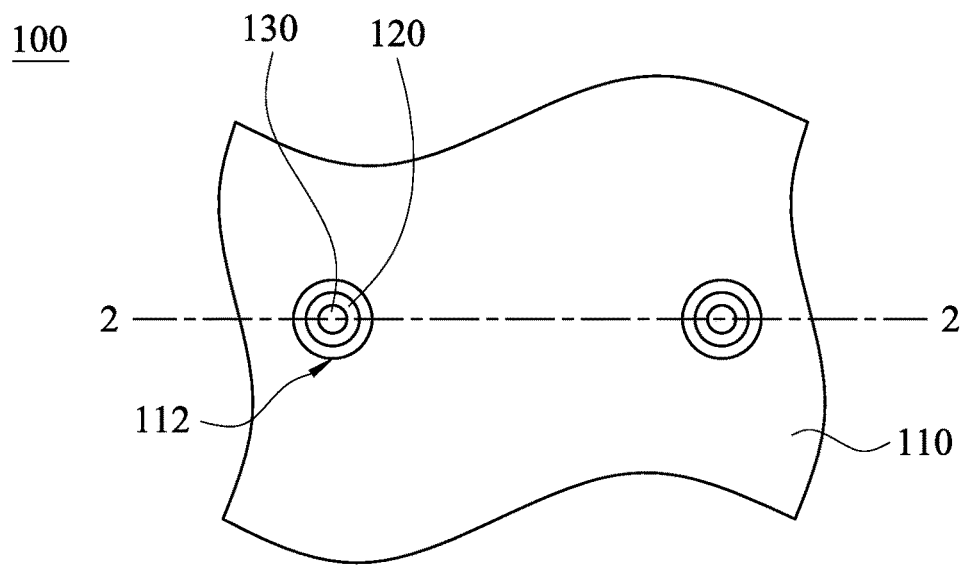
FIG. 1 is a top view of a semiconductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
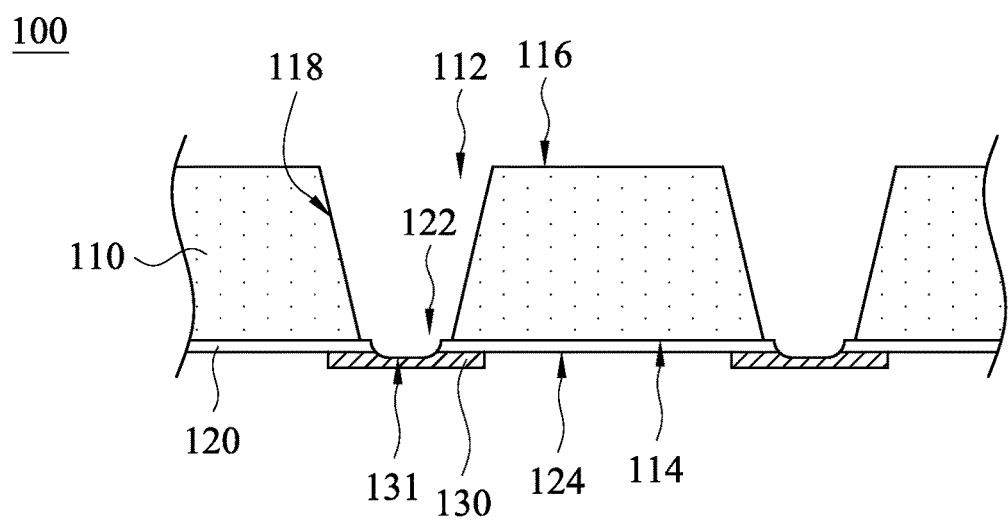
FIG. 2 is a cross-sectional view of the semiconductor structure taken along line 2-2 shown in FIG. 1.

FIG. 1 is a top view of a semiconductor structure 100 according to one embodiment of the present invention. FIG. 2 is a cross-sectional view of the semiconductor structure 100 taken along line 2-2 shown in FIG. 1. As shown in FIG. 1 and FIG. 2, the semiconductor structure 100 includes a wafer substrate 110, a first isolation layer 120, and a conductive pad 130. The wafer substrate 110 has a hollow region 112, a first surface 114, and a second surface 116 opposite to the first surface 114. The hollow region 112 is through the first and second surfaces 114, 116. The first isolation layer 120 is located on the first surface 114 of the wafer substrate 110 and has a first opening 122. The first opening 122 is communicated with the hollow region 112. The conductive pad 130 is located on the surface 124 of the first isolation layer 120 facing away from the wafer substrate 110. The conductive pad 130 covers the first opening 122, such that the conductive pad 130 may be exposed through the hollow region 112. The conductive pad 130 may be an electrical pad or an extension pad. In addition, a U-shaped recess 131 is formed on the first isolation layer 120 and the conductive pad 130.

FIG. 3 is a partially enlarged view of the semiconductor structure 100 shown in FIG. 2. As shown in FIG. 2 and FIG. 3, the conductive pad 130 has a concave portion 132 that faces the first opening 122. The first isolation layer 120 has an oblique surface 126 that surrounds the first opening 122, such that the recess 131 with U-shaped cross-section is formed by the concave portion 132 of the conductive pad 130 and the oblique surface 126 of the first isolation layer 120. The recess 131 is formed by a laser etching treatment that is performed on the first isolation layer 120 and the conductive pad 130. Since the depth D1 of the recess 131 formed by laser etching is greater than the thickness D2 of the first isolation layer 120, at least a portion of the recess 131 extends in the conductive pad 130 to form the concave portion 132 in the conductive pad 130.

In this embodiment, the semiconductor structure 100 may be manufactured to be an image sensor, a MEMS element, a calculating processor, etc. The wafer substrate 110 may be made of a material including silicon. The first isolation layer 120 may be silicon oxide, such as silicon dioxide, but the present invention is not limited in this regard. The conductive pad 130 may be made of a material including aluminum, copper, or other conductive metals, and the present invention is not limited in this regard.

In the following description, the manufacturing method of the semiconductor structure 100 will be described.

FIG. 4 is a flow chart of a manufacturing method of a semiconductor structure according to one embodiment of the present invention. In step S1, a first isolation layer is formed on a first surface of a wafer substrate. Thereafter in step S2, a conductive pad is formed on the first isolation layer. Next in step S3, a hollow region through the first surface and a second surface of the wafer substrate is formed, such that the first isolation layer is exposed through the hollow region. Finally in step S4, a laser etching treatment is performed on the first isolation layer that is exposed through the hollow region, such that a first opening is formed in the first isolation layer, and a concave portion exposed through the first opening is formed in the conductive pad. In the following description, the aforesaid steps in the manufacturing method of the semiconductor structure will be described.

Figure 5:
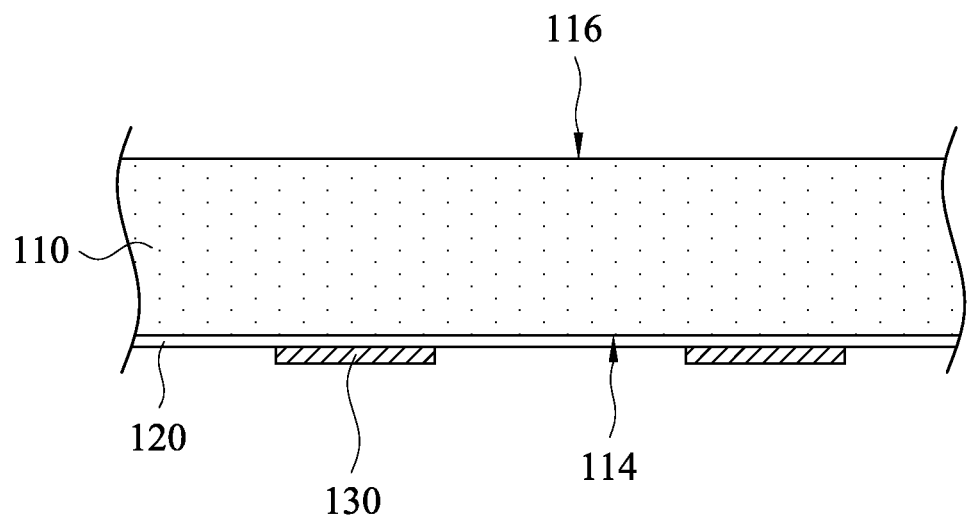
FIG. 5 is a cross-sectional view of a first isolation layer and a conductive pad after being formed on a wafer substrate shown in FIG. 4.

FIG. 5 is a cross-sectional view of the first isolation layer 120 and the conductive pad 130 after being formed on the wafer substrate 110 shown in FIG. 4. As shown in FIG. 5, the wafer substrate 110 has the first surface 114 and the second surface 116 opposite to the first surface 114. In step S1 of FIG. 4, the first isolation layer 120 may be formed on the first surface 114 of the wafer substrate 110. Thereafter in step S2 of FIG. 4, the conductive pad 130 may be formed on the first isolation layer 120.

Figure 6:
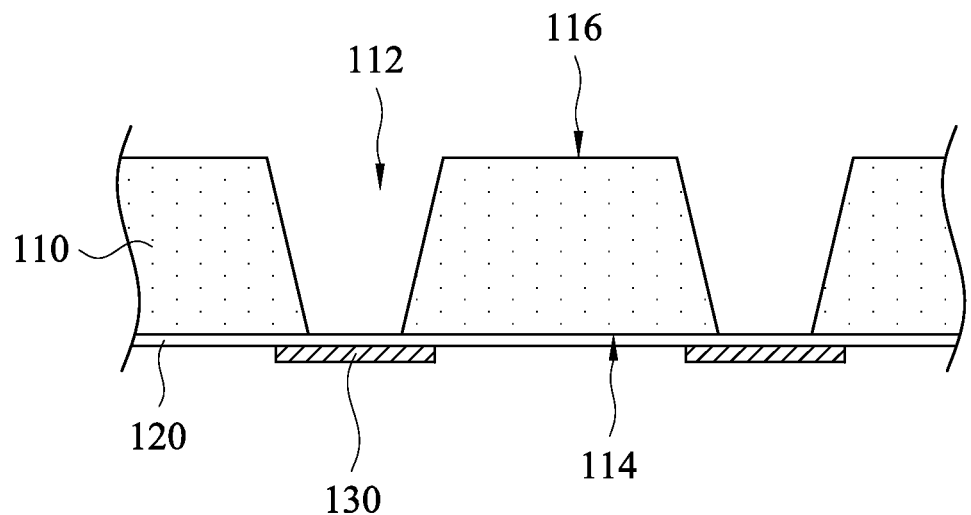
FIG. 6 is a cross-sectional view of a hollow region after being formed in the wafer substrate shown in FIG. 5.

FIG. 6 is a cross-sectional view of the hollow region 112 after being formed in the wafer substrate 110 shown in FIG. 5. As shown in FIG. 5 and FIG. 6, after the first isolation layer 120 and the conductive pad 130 are formed on the first surface 114 of the wafer substrate 110, in step S3 of FIG. 4, the hollow region 112 through the first and second surfaces 114, 116 of the wafer substrate 110 may be formed by utilizing photolithography technique to pattern the wafer substrate 110. The photolithography technique may include coating photoresist, exposure, development, and etching processes. After the hollow region 112 is formed in the wafer substrate 110, the wafer substrate 110 has a third surface 118 that surrounds the hollow region 112, and the first isolation layer 120 is exposed through the hollow region 112.

Figure 7:
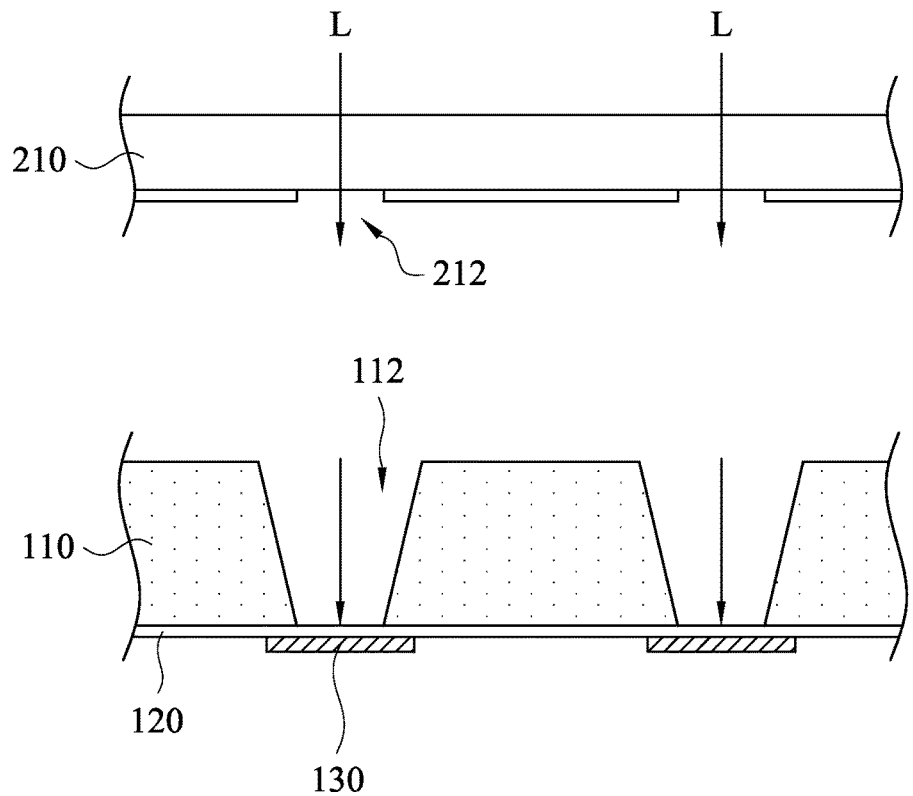
FIG. 7 is a cross-sectional view of the first isolation layer shown in FIG. 6 when a laser etching treatment is performed.

FIG. 7 is a cross-sectional view of the first isolation layer 120 shown in FIG. 6 when the laser etching treatment is performed. After the first isolation layer 120 is exposed through the hollow region 112 of the wafer substrate 110, in step S4 of FIG. 4, the laser etching treatment may be performed on the first isolation layer 120, such that the first opening 122 (see FIG. 3) is formed in the first isolation layer 120, and the concave portion 132 (see FIG. 3) exposed through the first opening 122 is formed in the conductive pad 130. As a result, the semiconductor structure 100 shown in FIG. 2 can be obtained.

In this embodiment, performing the laser etching treatment on the first isolation layer 120 includes the following steps. A mask 210 that has a through hole 212 is provided. The mask 210 is disposed above the wafer substrate 110, such that the through hole 212 of the mask 210 is aligned with the hollow region 112 of the wafer substrate 110. Thereafter, a laser light L may irradiate the first isolation layer 120 through the through hole 121 of the mask 210 so as to form the first opening 122 and the concave portion 132 shown in FIG. 3.

As shown in FIG. 2 and FIG. 2, the laser etching treatment is performed on the first isolation layer 120 to form the first opening 122, and the concave portion 132 exposed through the first opening 122 may be formed in the conductive pad 130 at the same time when the first isolation layer 120 is etched by laser. Hence, the first isolation layer 120 has the oblique surface 126 that surrounds the first opening 122, such that the recess 131 with U-shaped cross-section may be formed by the concave portion 132 and the oblique surface 126. As a result, when the redistribution layer is formed on the surface of the conductive pad 130 for electrical contact, the contact area between the U-shaped recess 131 and the redistribution layer is enough, so that poor contact is not prone to occur. Therefore, the yield rate of the semiconductor structure 100 may be improved. Moreover, since the precision of the laser etching treatment is high, the risk of penetrating the conductive pad 130 may be reduced and the thickness of the conductive pad 130 may be decreased for saving cost. In the following description, the next manufacturing process of the semiconductor structure 100 shown in FIG. 2 will be described.

Figure 8:
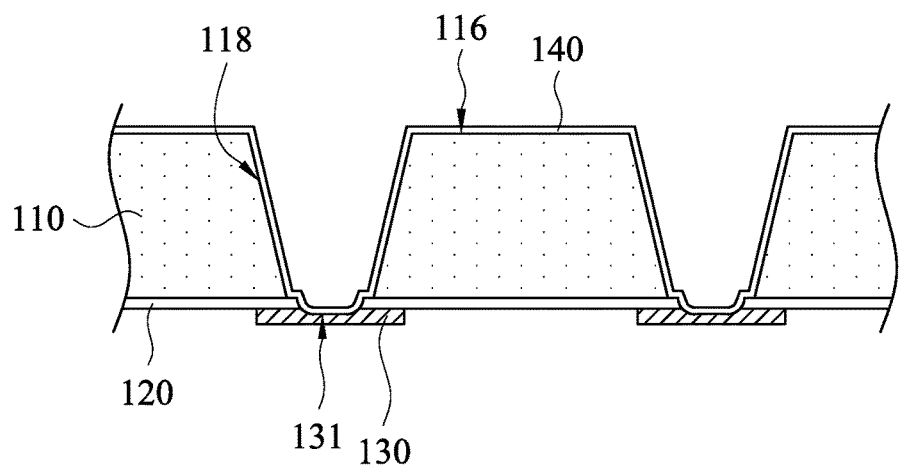
FIG. 8 is a cross-sectional view of a second isolation layer after being formed on a recess and the wafer substrate shown in FIG. 2.
Figure 9:
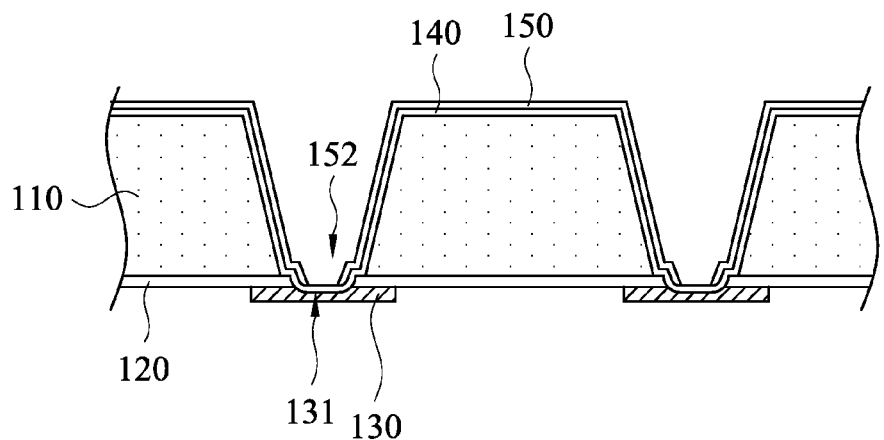
FIG. 9 is a cross-sectional view of a patterned photoresist layer after being formed on the second isolation layer shown in FIG. 8.

FIG. 8 is a cross-sectional view of a second isolation layer 140 after being formed on the recess 131 and the wafer substrate 110 shown in FIG. 2. FIG. 9 is a cross-sectional view of a patterned photoresist layer 150 after being formed on the second isolation layer 140 shown in FIG. 8. As shown in FIG. 8 and FIG. 9, after the U-shaped recess 131 is formed in the first isolation layer 120 and the conductive pad 130, the second isolation layer 140 may be formed on the recess 131 and the second and third surfaces 116, 118 of the wafer substrate 110. The second isolation layer 140 may be formed by spray coating. The second isolation layer 140 may be made of a material including silicon oxide, such as silicon dioxide, but the present invention is not limited in this regard. Thereafter, the patterned photoresist layer 150 may be formed on the second isolation layer 140. In this embodiment, the photoresist layer 150 has an opening 152 to expose the second isolation layer 140.

Figure 10:
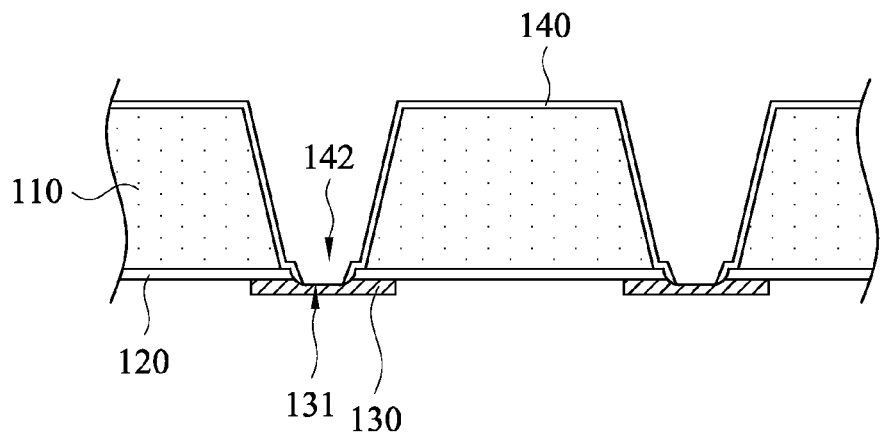
FIG. 10 is a cross-sectional view of a second opening after being formed in the second isolation layer shown in FIG. 9.

FIG. 10 is a cross-sectional view of a second opening 142 after being formed in the second isolation layer 140 shown in FIG. 9. As shown in FIG. 9 and FIG. 10, after the photoresist layer 150 is formed, a portion of the second isolation layer 140 that is not covered by the photoresist layer 150 (i.e., the second isolation layer 140 in the opening 152) may be etched, such that the second opening 142 is formed in the second isolation layer 140 to expose the conductive pad 130. Thereafter, the photoresist layer 150 may be removed, thereby obtaining the structure shown in FIG. 10. That is to say, after the second isolation layer 140 is patterned, the second opening 142 is formed.

Figure 11:
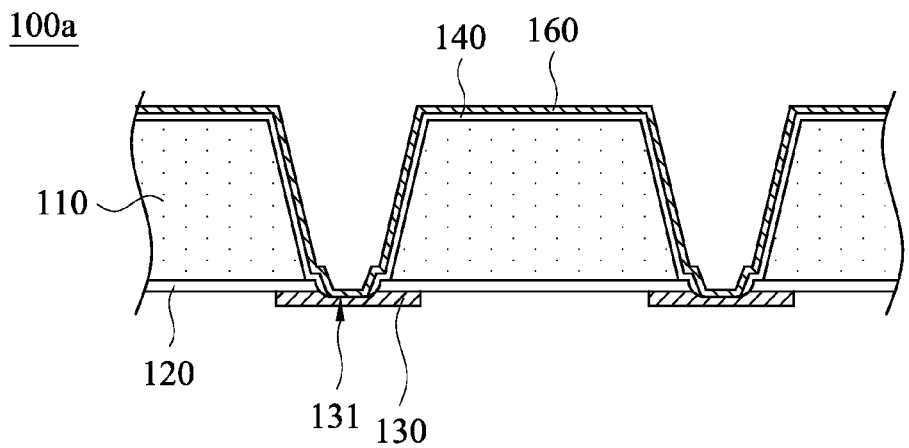
FIG. 11 is a cross-sectional view of a redistribution layer after being formed on the second isolation layer and the conductive pad shown in FIG. 10.

FIG. 11 is a cross-sectional view of a redistribution layer 160 after being formed on the second isolation layer 140 and the conductive pad 130 shown in FIG. 10. As shown in FIG. 10 and FIG. 11, after the patterned second isolation layer 140 is formed, the redistribution layer 160 may be formed on the second isolation layer 140 and the conductive pad 130 that is exposed through the second opening 142. As a result, the redistribution layer 160 can electrically contact the conductive pad 130 that is exposed through the second opening 142, and a semiconductor structure 100a shown in FIG. 11 is obtained. The redistribution layer 160 may be made of a material including aluminum, copper, or other conductive metals, and the present invention is not limited in this regard.

Figure 12:
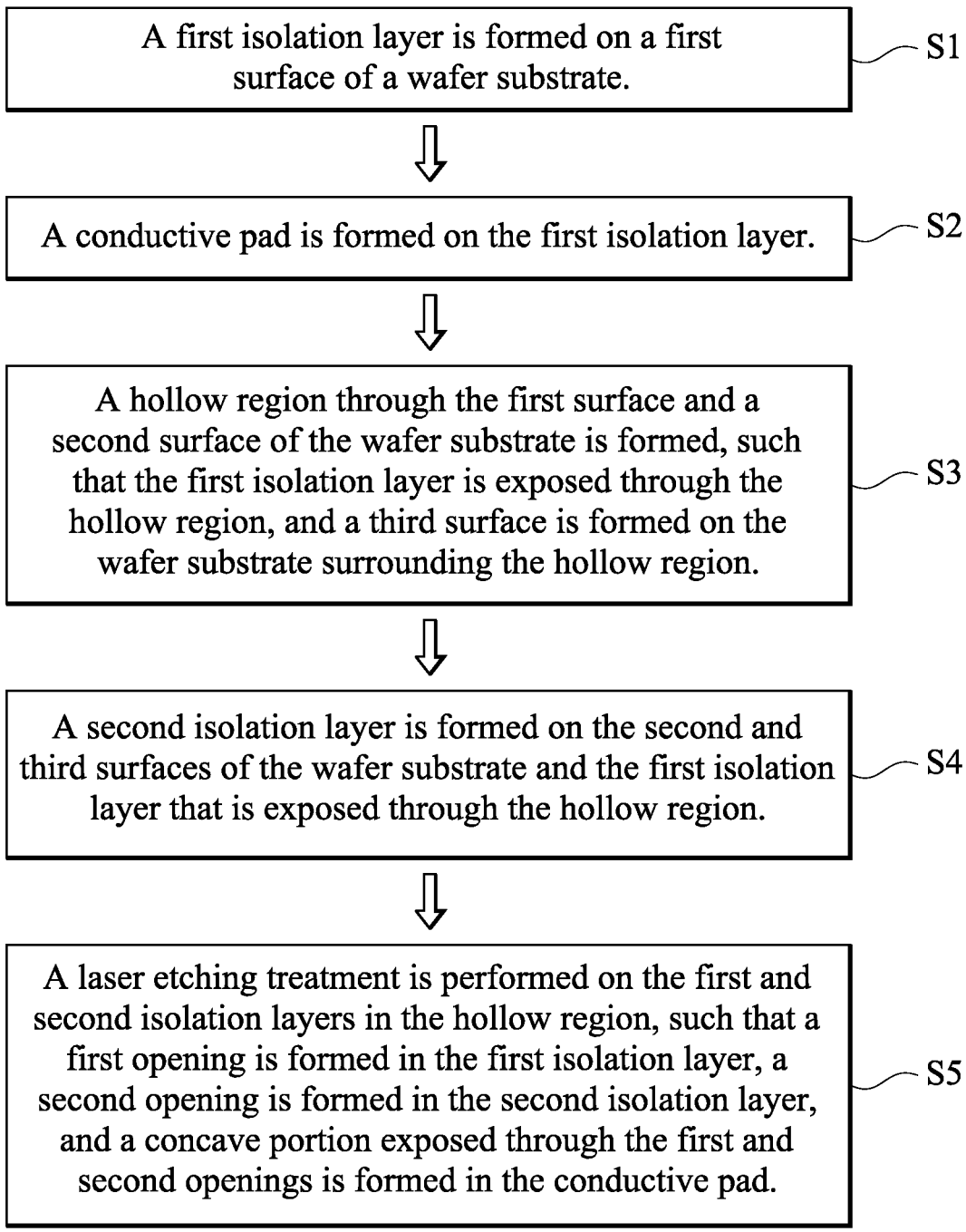
FIG. 12 is a flow chart of a manufacturing method of a semiconductor structure according to one embodiment of the present invention.

FIG. 12 is a flow chart of a manufacturing method of a semiconductor structure according to one embodiment of the present invention. In step S1, a first isolation layer is formed on a first surface of a wafer substrate. Thereafter in step S2, a conductive pad is formed on the first isolation layer. Next in step S3, a hollow region through the first surface and a second surface of the wafer substrate is formed, such that the first isolation layer is exposed through the hollow region, and a third surface is formed on the wafer substrate surrounding the hollow region. Thereafter in step S4, a second isolation layer is formed on the second and third surfaces of the wafer substrate and the first isolation layer that is exposed through the hollow region. Finally in step S5, a laser etching treatment is performed on the first and second isolation layers in the hollow region, such that a first opening is formed in the first isolation layer, a second opening is formed in the second isolation layer, and a concave portion exposed through the first and second openings is formed in the conductive pad. Since steps S1 to S3 are similar to FIG. 4, steps S1 to S3 will not described again. In the following description, the aforesaid step S4 and step S5 of the manufacturing method of the semiconductor structure will be described.

Figure 13:
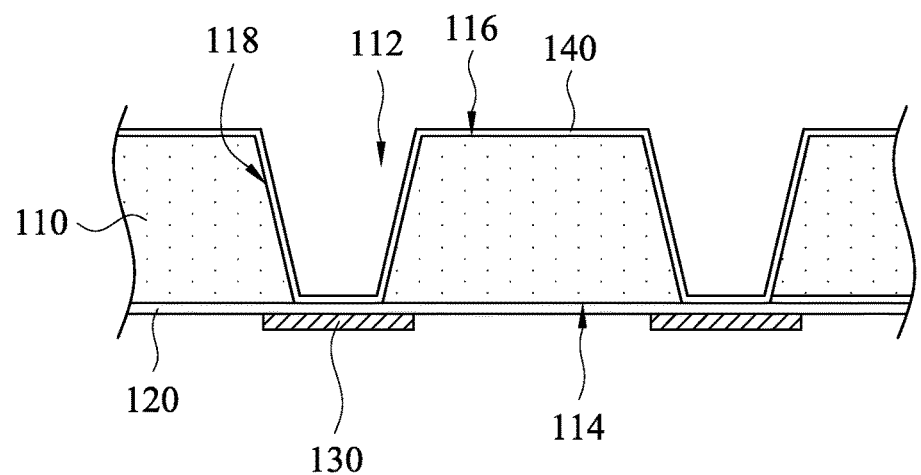
FIG. 13 is a cross-sectional view of a first isolation layer, a conductive pad, and a second isolation layer after being formed on a wafer substrate shown in FIG. 12.

FIG. 13 is a cross-sectional view of the first isolation layer 120, the conductive pad 130, and the second isolation layer 140 after being formed on the wafer substrate 110 shown in FIG. 12. As shown in FIG. 6 and FIG. 13, after the hollow region 112 is formed in the wafer substrate 110, the first isolation layer 120 is exposed through the hollow region 112. Thereafter in step S4 of FIG. 12, the second isolation layer 140 may be formed on the second and third surfaces 116, 118 of the wafer substrate 110 and the first isolation layer 120 that is exposed through the hollow region 112, as shown FIG. 13.

Figure 14:
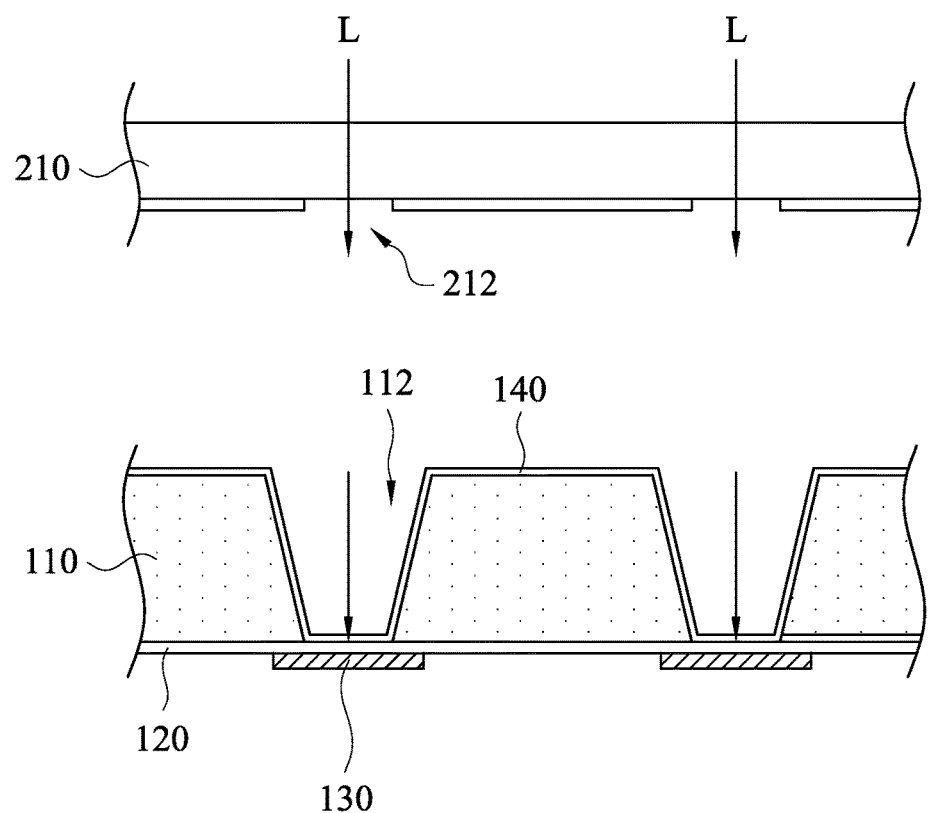
FIG. 14 is a cross-sectional view of the second isolation layer shown in FIG. 13 when a laser etching treatment is performed.
Figure 15:
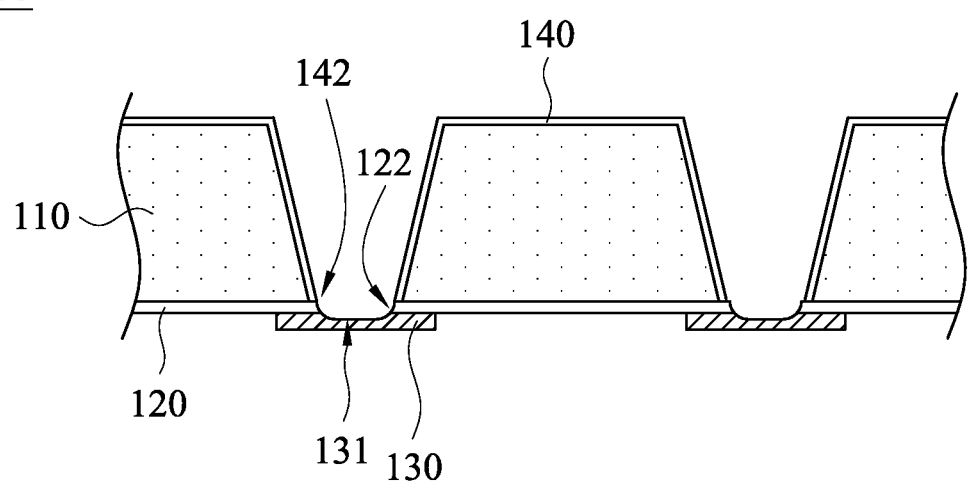
FIG. 15 is a cross-sectional view of the first and second isolation layers and the conductive pad shown in FIG. 14 after the laser etching treatment is finished.

FIG. 14 is a cross-sectional view of the second isolation layer 140 shown in FIG. 13 when a laser etching treatment is performed. FIG. 15 is a cross-sectional view of the first and second isolation layers 120, 140 and the conductive pad 130 shown in FIG. 14 after the laser etching treatment is finished. As shown in FIG. 14 and FIG. 15, after the second isolation layer 140 is formed, in step S5 of FIG. 12, the laser etching treatment may be performed on the first and second isolation layers 120, 140 in the hollow region 112, such that the first opening 122 is formed in the first isolation layer 120, the second opening 142 is formed in the second isolation layer 140, and the concave portion 132 (see FIG. 3) exposed through the first and second openings 122, 142 is formed in the conductive pad 130, thereby forming the U-shaped recess 131. Therefore, a semiconductor structure 100b shown in FIG. 15 may be obtained.

In this embodiment, performing the laser etching treatment on the first and second isolation layers 120, 140 includes the following steps. The mask 210 that has the through hole 212 is provided. The mask 210 is disposed above the wafer substrate 110, such that the through hole 212 of the mask 210 is aligned with the hollow region 112 of the wafer substrate 110. Thereafter, a laser light L may irradiate the first isolation layer 120 through the through hole 121 of the mask 210 so as to form the recess 131. After the recess 131 is formed, the redistribution layer may be formed on the second isolation layer 140 and the conductive pad 130 that is exposed through the first and second openings 122, 142.

As shown in FIG. 3 and FIG. 15, the laser etching treatment is performed on the first and second isolation layers 120, 140 to respectively form the first and second openings 122, 142, and the concave portion 132 exposed through the first and second openings 122, 142 may be formed in the conductive pad 130 at the same time when the first and second isolation layers 120, 140 are etched by laser. As a result, when the redistribution layer is formed on the surface of the conductive pad 130 for electrical contact, the contact area between the U-shaped recess 131 and the redistribution layer is enough, so that poor contact is not prone to occur. Therefore, the yield rate of the semiconductor structure 100b may be improved. Moreover, since the precision of the laser etching treatment is high, the risk of penetrating the conductive pad 130 may be reduced and the thickness of the conductive pad 130 may be decreased for saving cost.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
   a wafer substrate having a hollow region, a first surface, a second surface opposite to the first surface, and a third surface that surrounds the hollow region, wherein the hollow region is through the first and second surfaces;
   a first isolation layer located on the first surface of the wafer substrate and having a first opening, wherein the first opening is communicated with the hollow region, and a portion of the first isolation layer protrudes outward from the third surface of the wafer substrate;
   a conductive pad located on a surface of the first isolation layer facing away from the wafer substrate, the conductive pad covering the first opening so as to be exposed through the hollow region, and the conductive pad having a concave portion that faces the first opening, wherein the first isolation layer has an oblique surface that surrounds the first opening, such that a recess with U-shaped cross-section is formed by the concave portion and the oblique surface, and a diameter of the recess is smaller than a diameter of the hollow region; and
   a second isolation layer disposed along the second and third surfaces of the wafer substrate, and overlying the portion of the first isolation layer that protrudes outward from the third surface of the wafer substrate, and having a second opening exposing the conductive pad, wherein a diameter of the second opening of the second isolation layer is smaller than the diameter of the recess.

2. The semiconductor structure of claim 1, further comprising:
a redistribution layer located on the second isolation layer and electrically contacting the conductive pad that is exposed through the second opening.

3. The semiconductor structure of claim 1, wherein a depth of the recess is greater than a thickness of the first isolation layer.

4. The semiconductor structure of claim 1, wherein the first isolation layer extends and terminates at an edge defining the first opening, wherein the edge is beyond the third surface of the wafer substrate.

5. The semiconductor structure of claim 4, wherein the edge of the first isolation layer is not co-planar with the third surface of the wafer substrate.

6. The semiconductor structure of claim 5, wherein the first isolation layer does not extend to cover the third surface of the wafer substrate.

7. The semiconductor structure of claim 1, wherein the first isolation layer does not extend to cover the third surface of the wafer substrate.

8. The semiconductor structure of claim 1, wherein an orthogonal projection of the wafer substrate on the first isolation layer is outside the entire recess.

9. The semiconductor structure of claim 1, wherein the concave portion of the conductive pad and the oblique surface of the first isolation layer are contiguous surfaces to form the U-shaped cross-section.

10. The semiconductor structure of claim 1, wherein the oblique surface of the first isolation layer does not contact the wafer substrate.

11. The semiconductor structure of claim 1, wherein the conductive pad does not extend to between the first isolation layer and the second isolation layer.

* * * * *